(12) United States Patent
Chun et al.

(10) Patent No.: US 6,927,429 B2
(45) Date of Patent: Aug. 9, 2005

(54) INTEGRATED CIRCUIT WELL BIAS CIRCUITY

(75) Inventors: Christopher K. Y. Chun, Austin, TX (US); Der Yi Sheu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 10/366,842

(22) Filed: Feb. 14, 2003

(65) Prior Publication Data

US 2004/0159858 A1 Aug. 19, 2004

(51) Int. Cl.$^7$ ............................................. H01L 27/10
(52) U.S. Cl. ..................... 257/207; 257/208; 257/211; 257/204; 257/393
(58) Field of Search ............................... 365/63; 257/202, 257/204, 207, 208, 211, 393; 438/128, 129

(56) References Cited

U.S. PATENT DOCUMENTS

| | | | | |
|---|---|---|---|---|
| 5,452,245 A | * | 9/1995 | Hickman et al. | 365/154 |
| 5,493,135 A | * | 2/1996 | Yin | 257/204 |
| 5,698,872 A | * | 12/1997 | Takase et al. | 257/206 |
| 5,867,418 A | * | 2/1999 | Okasaka et al. | 365/52 |
| 5,977,574 A | * | 11/1999 | Schmitt et al. | 257/207 |
| 6,088,255 A | * | 7/2000 | Matsuzaki et al. | 365/76 |
| 6,107,869 A | * | 8/2000 | Horiguchi et al. | 327/544 |
| 6,218,708 B1 | | 4/2001 | Burr | |
| 6,462,978 B2 | * | 10/2002 | Shibata et al. | 365/63 |
| 6,504,770 B2 | * | 1/2003 | Kitsukawa et al. | 365/200 |
| 6,507,052 B1 | * | 1/2003 | Suzuki | 257/207 |
| 6,707,139 B2 | * | 3/2004 | Fujii et al. | 257/678 |
| 6,768,144 B2 | * | 7/2004 | Houston et al. | 257/207 |
| 6,785,182 B2 | * | 8/2004 | Kamei et al. | 365/226 |

OTHER PUBLICATIONS

Miroyuki Mizuno et al., "An 18–$\mu$A Standby Current 1.8–V, 200–MHz Microprocessor with Self–Substrate–Biased Data–Retention Mode," *IEEE Journal of Solid–State Circuits*, Nov. 1999, vol. 34, No. 11, pp. 1492–1500.

* cited by examiner

*Primary Examiner*—Tom Thomas
*Assistant Examiner*—Eugene Lee
(74) *Attorney, Agent, or Firm*—David G. Dolezal

(57) ABSTRACT

Well bias circuitry for selectively biasing the voltages of the well areas of an integrated circuit. In one embodiment, the well bias circuitry includes a switching cell located in a row of cells of the integrated circuit for selectively coupling a voltage supply line to a well bias line. The switching cell may include two level shifters, each for providing a voltage to a gate of a coupling transistor to make the coupling transistor non conductive in response to an enable signal. The switching cells may be sequentially coupled such that the coupling transistors of each of the switching cells are not made conductive at the same time so as to reduce inrush current due to changing the well bias from a well bias voltage to a supply voltage. In one example, the switching cells may include delay circuitry for delaying the change in state of the enable signal before being provided to the next switching cell.

16 Claims, 3 Drawing Sheets

INTEGRATED CIRCUIT WELL BIAS CIRCUITY

BACKGROUND OF THE INVENTION

1. Field of the Invention

This invention relates in general to an integrated circuit and more specifically to well biasing circuitry for transistors of an integrated circuit.

2. Description of the Related Art

Integrated circuits utilize transistors, such as e.g. CMOS transistors, for implementing logic circuitry of the integrated circuit. In one example, logic circuitry is implemented in rows of cells of an integrated circuit. These rows may contain N well areas and P well areas that are utilized to implement the transistors of the logic circuitry.

In some embodiments, during the normal operation of the integrated circuit, the N well area is biased with a supply voltage of VDD and the P well area is biased with a supply ground voltage VSS. For some transistor types, such as CMOS, the sub threshold leakage current of the transistors may be unacceptably large, such that the integrated circuit draws large amounts of current during standby. In order to reduce power during standby, the N well areas maybe biased with a voltage that is higher than the supply voltage VDD and the P well areas may be biased with a voltage that is lower than the supply voltage VSS. However, circuitry for selectively biasing the well areas of an integrated circuit may occupy an unacceptable amount of space of the integrated circuit and/or may generate a large amount of inrush current during a change in well bias voltages.

What is needed is improved circuitry for selectively biasing the well areas of an integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not, be taken to be limiting.

Figure 1:
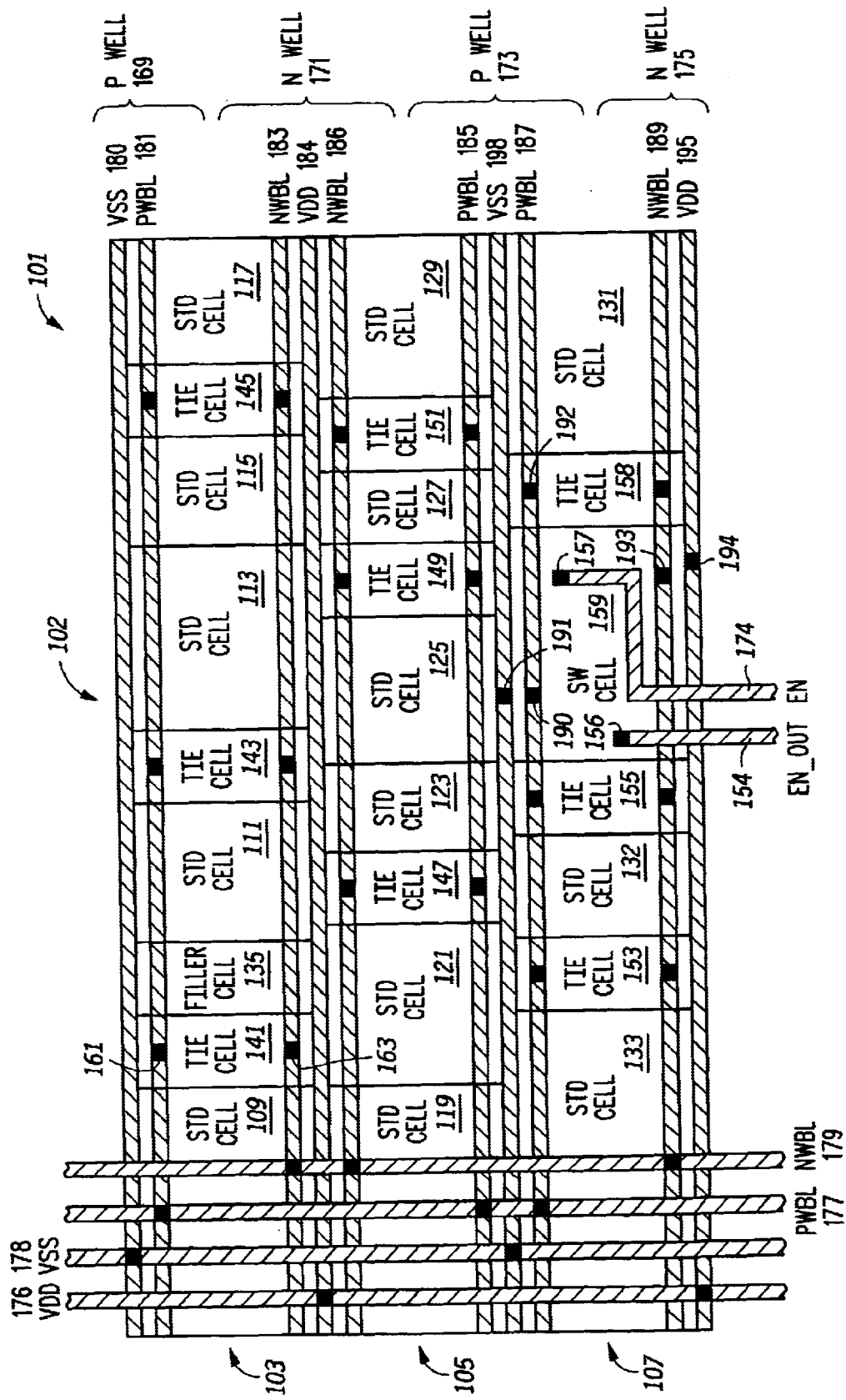
FIG. 1 is a partial top view of one embodiment of an integrated circuit according to the present invention.

FIG. 1 is a partial top view of an integrated circuit according to the present invention. Integrated circuit 101 includes logic circuitry implemented in standard cells (e.g. 111) in a sea of gates 102 of integrated circuit 101. Sea of gates 102 includes a plurality of rows of cells with row of cells 103, 105, and 107 being shown in FIG. 1. Row of cells 103 includes standard cells 109, 111, 113, 115, and 117. Row of cells 105 includes standard cells 119, 121, 123, 125, 127, and 129. Row of cells 107 includes standard cells 133, 132, and 131. Each standard cell includes a plurality of transistors to implement a logic function of the integrated circuit. In one embodiment, these transistors are CMOS transistors. As will be discussed further, sea of gates 102 includes switching cells (e.g. 159) that allow the P well areas and the N well areas of the sea of gates to each be selectively biased at different voltages from the supply voltages.

Each row of cells includes an N well area and a P well areas for implementing the transistors of the logic circuitry in the cells of that row. In one embodiment, the N well areas and the P well areas are doped regions of the semiconductor substrate of integrated circuit 101. For example, row of cells 103 includes P well area 169 which runs along the top portion of row of cells 103, relative to the view shown in FIG. 1, and a portion of N well area 171 which runs along the bottom of row of cells 103, relative to the view shown in FIG. 1. A portion of N well area 171 serves as the N well area for row of cells 105.

Each row of cells includes multiple tie cells (e.g. 141) for coupling a well area to a well bias line (e.g. 181 and 183) located in a metal layer above the substrate. For example, row of cells 103 includes tie cells 141, 143, and 145. Each of tie cells 141, 143, and 145 include a via-contact structure (e.g. 161 for tie cell 141) for coupling P well bias line 181 to P well area 169 and a via-contact structure (e.g. 163 for tie cell 141) for coupling N well bias line 183 to N well area 171. Via-contact structure 161 includes both a via and a well bias contact for coupling bias line 181, which in one embodiment is located in the second metal layer, to P well area 169 of the substrate. Row of cells 105 includes tie cells 147, 149, and 151 having via-contact structures for coupling N well bias line 186 to N well area 171 and for coupling P well bias line 185 to P well area 173. Row of cells 107 includes tie cells 153, 155, and 158 having via-contact structures for coupling P well bias line 187 to P well area 173 and coupling N well bias line 189 to N well area 175. P well areas 169 and 173 are biased by the voltage of the P well bias lines 181, 185, and 187. N well areas 171 and 175 are biased by the voltage of N well bias lines 183, 186, and 189.

As shown in the embodiment of FIG. 1, the tie cells in each row of cells are non uniformly spaced from each other. This non uniformity of spacing of the tie cells is due to their placement in areas of the rows of cells that are not occupied by standard cells. The ability to place the tie cells in a non uniform placement aids in the flexibility of the layout of sea of gates 102. In one embodiment, the tie cells are placed in a row such that they are located no further than a certain distance of each other. In one embodiment, the tie cells are located no further than 186 microns from each other in a cell.

The P well bias lines 181, 185, and 187 are coupled together by vertical P well bias line 177, which is located in a higher metal layer (e.g. metal layer 3). N well bias lines 183, 186, and 189 are coupled together by vertical N well bias line 179, also located in metal layer 3 in one embodiment. Vertical bias lines 177 and 179 are coupled to a charge pump circuit (e.g. 307 of FIG. 3) and can be selectively supplied with voltages VPW and VNW, respectively, that are lower than VSS and higher than VDD, respectively, so as to selectively bias the P well areas and N Well areas at VPW and VNW, respectively. In one embodiment VDD is 1.5 V, VSS is 0V, VNW is 2.1 volts and VPW −1.0V. However in other embodiments, VNW maybe less than VDD and/or VPW maybe greater than VSS.

Horizontal VDD supply voltage lines 184 and 195 are located in the first metal layer and are coupled together by an upper layer vertical VDD line 176. Horizontal VSS supply voltage lines 180 and 198 are located in the first metal layer and are coupled together by an upper layer vertical VSS line 178. These supply voltage lines supply the cells with supply voltages VDD and VSS.

Sea of gates 102 includes switching cells (e.g. 159) for coupling the P well bias lines (e.g. 187) to the VSS voltage lines (e.g. 198) and for coupling the N well bias lines (e.g. 189) to the VDD voltage lines (e.g. 195) in response to a state of an enable signal on enable line 174. These switching cells enable the well areas to be selectively biased, based upon the enable signal, to the supply voltages VDD or VSS or to voltages VNW and VPW.

Figure 2:
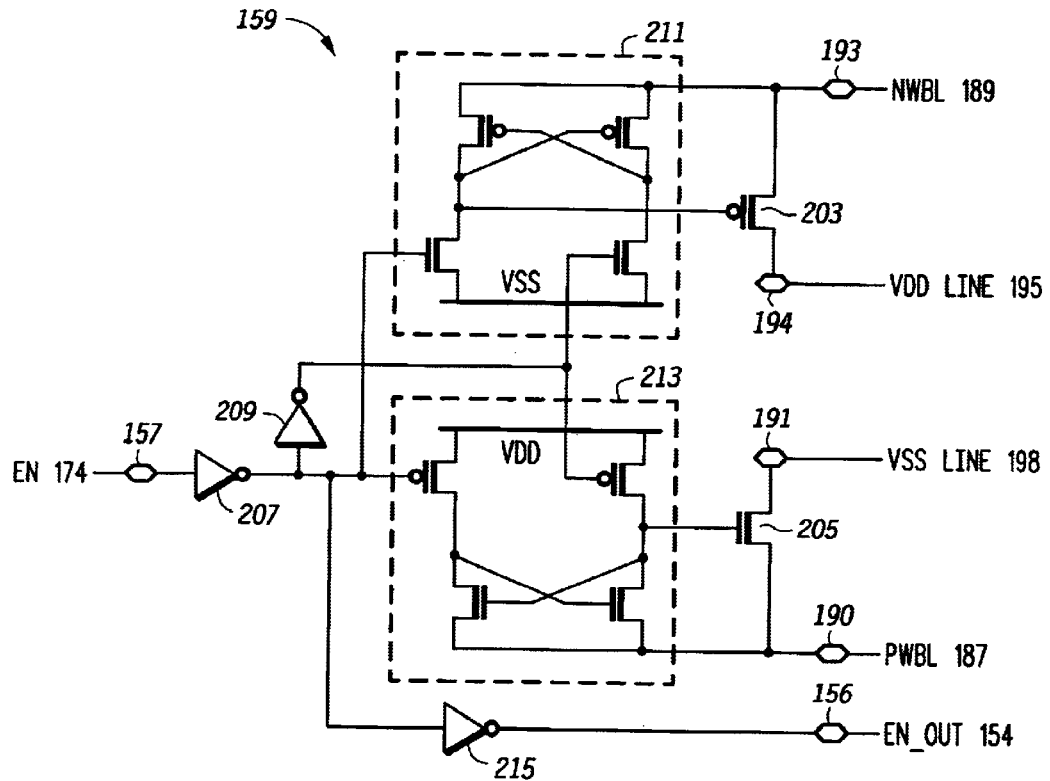
FIG. 2 is a circuit diagram of one embodiment of a switching cell according to the present invention.

FIG. 2 is a circuit diagram of switching cell 159. Switching cell 159 includes a PMOS coupling transistor 203, which serves as a switch for coupling N well bias line 189 to VDD line 195 through via-contact structures 193 and 194. Via-contact structure 193 is also coupled to P well area 173 (see FIG. 1). Switching cell 159 also includes an NMOS coupling transistor 205 for coupling P well bias line 187 to VSS line 198 through via-contact structures 190 and 191. Via-contact structure 190 is also coupled to N well area 175 (see FIG. 1).

Switching cell 159 receives an enable signal from enable line 174 through via-contact structure 157. The enable signal controls whether or not coupling transistors 203 and 205 are conductive to couple line 189 to line 195 and line 187 to line 198, respectively, to bias N well areas 175 and 171 to VDD and to bias P well areas 173 and 169 to VSS, respectively. When the signal on enable line 174 is high (e.g. VDD), transistors 203 and 205 are non conductive. When the signal on enable line 174 is low (e.g. VSS), transistors 203 and 205 are conductive.

Switching cell 159 also includes two level shifters 211 and 213 for supplying a voltage to the gates of transistors 203 and 205, respectively, to maintain the non conductivity of transistors 203 and 205 when the enable signal is in a state (VDD in the embodiment shown) for non conductivity. When the signal on line 174 is at a high state (e.g. VDD) where the transistors 203 and 205 are to be non conductive, the output of inverter 209 is also at a high state, which pulls the voltage of the gate of transistor 203 to the voltage level of N well bias line 189 (which is at VNW at that time). Accordingly, when line 189 is at VNW, the gate of transistor 203 is also at VNW, thereby maintaining the non conductivity of transistor 203. Likewise when enable signal on line 174 is at a high voltage state, the gate of transistor 205 is pulled to the voltage of line 187, which at that time is at VPW, and which is at lower voltage (e.g. −1.0V) than VSS (e.g. 0V).

Providing a switching cell with two coupling transistors responsive to a control line may enable a switching cell to selectively couple the N well bias line to the VDD line and selectively couple the P well bias line to the VSS line with only one control signal line (e.g. on line 174). Accordingly, the number of control signals needed to be routed in the metal layers for selective well biasing may be reduced, thereby saving area in the sea of gates.

Switching cell 159 also includes a control output (e.g. coupled to via-contact structure 156) that is coupled to the output enable line (En_Out) 154 for providing the enable signal to a next switching cell (e.g. 312 in FIG. 3) of sea of gates 102 whose control input (e.g. the line connected to via-contact structure 157 for switching cell 159) is coupled to line 154. In the embodiment of FIG. 2, inverters 207 and 215 located between via-contact structure 157 and via-contact structure 156 provide a delay in the enable signal before being provided to the next sequentially coupled switching cell (e.g. 312) located in sea of gates 102. One advantage that may occur from providing a delay in the enable signal is that it may allow each switching cell to bias the N well areas and P well areas with the VDD supply voltage and VSS supply voltage, respectively, at staggered times. Such staggering may limit the in rush current due to the change in voltage of the N well areas and P well areas in that all of the switching cells of a sea of gates do not couple the N well areas to VDD and P well areas to VSS at the same time.

Figure 3:
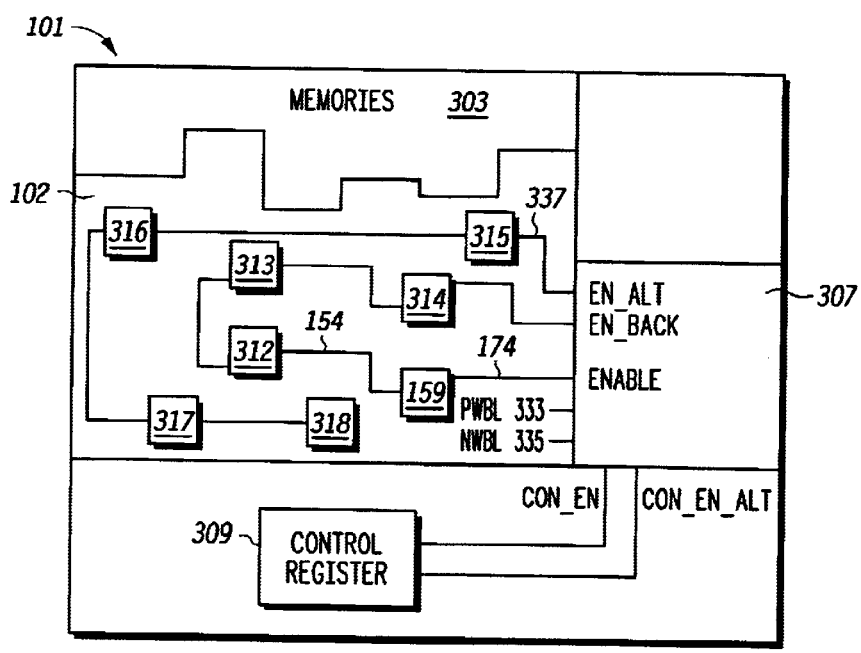
FIG. 3 is a circuit diagram of one embodiment of an integrated circuit according to the present invention.

FIG. 3 is a block diagram of integrated circuit 101. In one embodiment, integrated circuit 101 is an application processor. Integrated circuit 101 includes a memory 303, which in one embodiment, is located in an area of integrated circuit 101 that does not include circuitry for selectively biasing its N well areas and P well areas.

In the embodiment of FIG. 3, sea of gates 102 includes two sets of sequentially coupled switching cells. The first set includes switching cells 159, 312, 313 and 314, and the second set includes switching cells 315, 316, 317, and 318. Each of these switching cells is similar to switching cell 159 as shown in FIG. 2. Each set is sequentially coupled in that the control output (e.g. the line connected to via-contact structure 156 for switching cell 159) for a preceding switching cell in the sequence (e.g. switching cell 159) is coupled to the control input (e.g. the line connected to via-contact structure 157 in switching cell 159) of the next switching cell in the sequence. For example, switching cell 312 is the next switching cell in the sequence after switching cell 159. Accordingly, signal line 154 is coupled to the control input of switching cell 312.

Each switching cell in sea of gates 102 is located at a different area of sea of gates 102. Each switching cell can effectively couple the voltage supply lines carrying VDD and VSS to the N well areas and P well areas, respectively, for a given area. Accordingly, in one embodiment, the switching cells are spaced such that all of the sea of gates 102 is covered by an effective area of a switching cell. In the embodiment shown, the switching cells are placed in a non uniform pattern. The ability to place the switching cells in a non uniform pattern may allow for greater flexibility in the design of integrated circuit 101. In some embodiments, the effective area of a switching cell is dependent upon the process technology and the size of the coupling transistors of the switching cell.

Integrated circuit 101 includes a control register 309 whose contents control whether the N well and P well areas of sea of gates 102 are to be biased with the supply voltages VDD and VSS or the well bias voltages VNW and VPW. In the embodiment shown, control register 309 provides a first output signal CON_EN to control the conductivity of the PMOS and NMOS coupling transistors (e.g. 203 and 205 of switching cell 159) of the first set of switching cells (159, 312, 313, and 314) and provides a second output signal CON_EN_ALT for controlling the conductivity of the PMOS and NMOS coupling transistors of the second set of switching cells (315, 316, 317, and 318). In one embodiment, control register 309 is a control register of the clock control module (not shown) of integrated circuit 101. In some embodiments, the contents of register 309 may be set by a processor core (not shown) executing code, either internally or externally stored with respect to integrated circuit 101, or by firmware. In other embodiments, control register 309 may only provide one signal for controlling the bias voltages of the well areas of sea of gates 102.

Integrated circuit 101 includes a charge pump circuit 307 that provides an enable signal (ENABLE) to line 174 to control the conductivity of the PMOS and NMOS coupling transistors of the first set of switching cells (159, 312, 313, and 314) in response to the CON_EN signal received from control register 309. Charge pump circuit 307 also provides a second enable signal EN_ALT to enable line 337 for controlling the conductivity of the PMOS and NMOS coupling transistors of the second set of switching cells (315, 316, 317, and 318) in response to the CON_EN_ALT signal.

Charge pump circuit 307 includes an input for receiving the enable signal (EN_BACK) from the control output (e.g. the line connected to via-contact structure 156) of switching cell 314. With some embodiments, this signal can be used to indicate whether a change in state of the enable signal ENABLE has propagated through all of the switching cells of the first set of switching cells. In other embodiments, charge pump circuit 307 may also receive a signal from the control output of switching cell 318.

Charge pump circuit 307 also includes outputs coupled to P well bias line 333 and N well bias line 335 for selectively providing on those lines the VPW voltage and the VNW voltage, respectively, to bias the P well areas of sea of gates 102 and to bias the N well areas of sea of gates 102, respectively. P well bias line 333 is coupled to P well bias line 177 and N well bias line 335 is coupled to N well bias line 179 (see FIG. 1).

Figure 4:
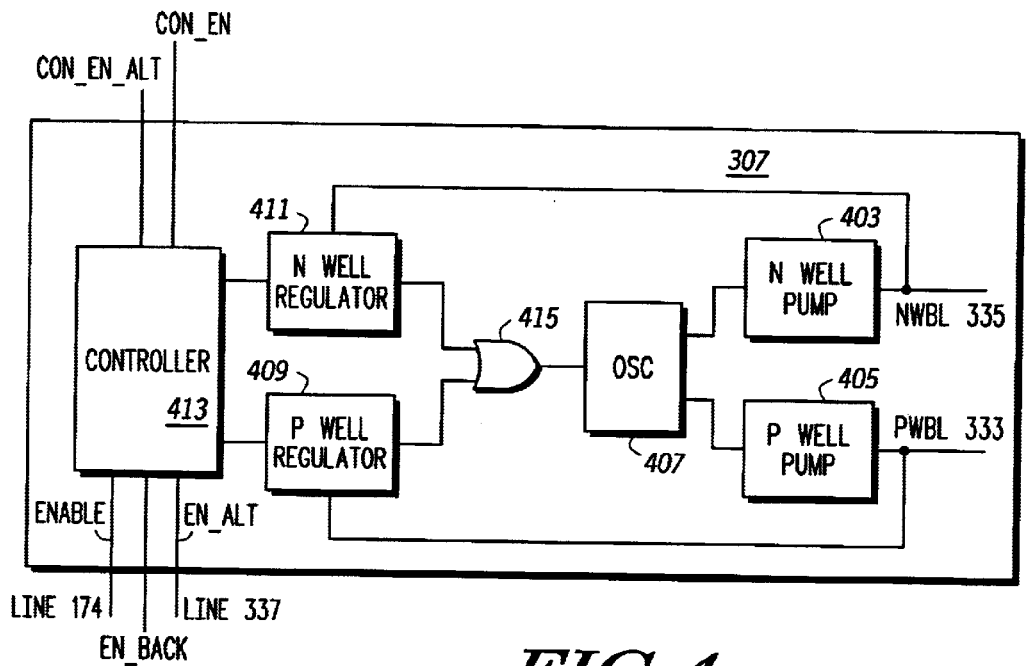
FIG. 4 is a circuit diagram of one embodiment of a portion of a charge pump circuit according to the present invention.

FIG. 4 is a block diagram of charge pump circuit 307. Charge pump circuit 307 includes a controller 413 that receives the CON_EN and CON_EN_ALT signals from control register 309 and receives the EN_BACK signal from switching cell 314. Controller 413 also provides the ENABLE signal and the EN_ALT signal.

Charge pump circuit 307 includes an N well charge pump 403, that when activated, provides at its output the VNW voltage on line 335. Charge pump circuit 307 also includes a P well charge pump 405, that when activated, provides at its output the VPW voltage on line 333. When charge pumps 403 and 405 are not activated, their outputs are tri-stated.

Charge pump circuit 307 includes an oscillator 407, that when turned on, activates charge pumps 403 and 405. Oscillator 407 is turned on through OR gate 415 by either N well regulator 411 or P well regulator 409. Regulator 411, when turned on by controller 413, turns on oscillator 407 in response to the voltage of the output of charge pump 403 falling below a predetermined voltage level. Regulator 409, when turned on by controller 413, turns on oscillator 407 in response to the voltage of the output of charge pump 405 rising above a predetermined voltage level. With other embodiments, regulator circuits having other configurations may be used.

When integrated circuit 101 is operating in a normal operating mode with the P well areas of sea of gates 102 biased to VSS and the N well areas of sea of gates 102 biased to VDD, the processor core (not shown) of integrated circuit 101, in one embodiment, initiates the placement of sea of gates 102 in a standby mode where the N well areas are biased at VNW and the P well areas are biased at VPW. This initiation is accomplished by writing a value to control register 309 to place the CON_EN signal in a state to make non conductive the PMOS and NMOS coupling transistors of the first set of switching cells (159, 312, 313, and 314) and to place the CON_EN_ALT signal in a state to make non conductive the PMOS and NMOS coupling transistors of the second set of switching cells (315, 316, 317, and 318). In response to the CON_EN signal and the CON_EN_ALT signal changing states, Controller 413 places the ENABLE signal in a state to sequentially make the PMOS and NMOS coupling transistors of the first set of switching cells (159, 312, 313, and 314) non conductive and places the EN_ALT signal in a state to sequentially make the PMOS and NMOS coupling transistors of the second set of switching cells (315, 316, 317, and 318) non conductive. Making the PMOS and NMOS coupling transistors of the switching cells of sea of gates 102 non conductive decouples the P well bit lines of sea of gates 102 from VSS and decouples the N well bit lines of sea of gates 102 from VDD. In other embodiments, the states of the CON_EN signal and the CON_EN_ALT signals may be changed at different times during a transition from a normal operating mode to a standby operating mode.

When the EN_Back signal has changed states due the change in state in the ENABLE signal (and thus indicating that the coupling transistors of the first set of switching cells have been made non conductive), Controller 413 then turns on regulators 411 and 409 which turn on oscillator 407 to activate N well charge pump 403 and P well charge pump 405 to provide the voltage VNW on line 335 and VPW on line 333, respectively. Providing VNW on line 335 and VPW on line 333 with the coupling transistors of the switching cells being nonconductive biases the N well areas of sea of gates 102 at VNW and biases the P well areas of sea of gates 102 at VPW respectively.

To transition from a standby mode wherein the N well areas are biased at VNW and the P well areas are biased at VPW to a normal operating mode where the N well areas are biased at VDD and the P well areas are biased at VSS, control register 309 changes the state of the CON_EN signal. In response, controller 413 disables regulators 411 and 409 such that they turn off oscillator 407. With oscillator 407 off, the outputs of pumps 403 and 405 (coupled to lines 335 and 333, respectively) become tri-stated. Controller 413 then changes the state of the ENABLE signal to a state to begin sequentially making the coupling transistors of the first set of switching cells conductive to couple the N well bias lines (e.g. 189) to the VDD voltage supply lines (e.g. 195) and P well bias lines (e.g. 187) to the VSS voltage supply lines (e.g. 198). In one embodiment, after a predetermined period of time, control register 309 changes the state of the CON_EN_ALT signal. In response, controller 413 changes the state of the EN_ALT signal to a state to begin sequentially making the coupling transistors of the second set of switching cells conductive to couple the N well bias lines to the VDD voltage supply lines and the P well bias lines to the VSS voltage supply lines.

Sequentially making conductive the coupling transistors of the switching cells may reduce the inrush current from coupling the bias well areas to the voltage supply lines. Providing two sets of independently controlled switching cells may enable the processor core (not shown) to have some control over the inrush current in that it can determine when the coupling transistors of the second set are made conductive. Thus, the time at which the coupling transistors of the second set are made conductive may be programmable or may be made in response to a measured parameter (e.g. measured current). In other embodiments, a sea of gates may include only one set of sequentially coupled switching cell or multiple sets of switching coils. Still in other embodiments, controller 413 may make the coupling of the coupling transistors of the second sot conductive in response to a change in state of the EN_BACK signal due to a change in state of the ENABLE signal.

Figure 5:
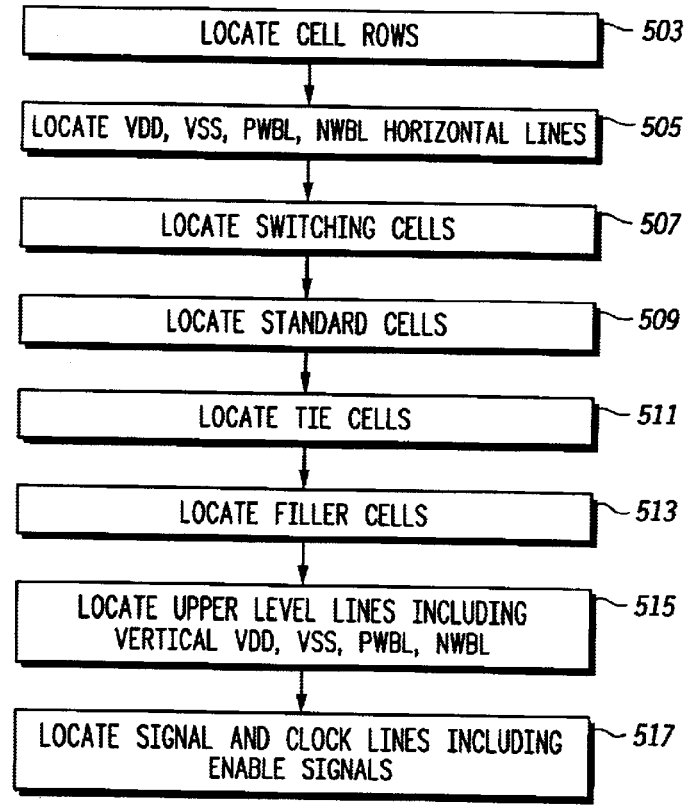
FIG. 5 is a flow diagram for one embodiment for the design of an integrated circuit according to the present invention.

FIG. 5 is a flow diagram for one embodiment for the design of an integrated circuit according to the present invention. In one embodiment, the flow of FIG. 5 is implemented with computer aided design tools.

In 503, the locations are established for the rows of cells in a sea of gates on a substrate of an integrated circuit. In 505, the layout is set for the horizontal VDD lines, horizontal VSS lines, horizontal P well bias lines, and horizontal N well Bias lines in the first metal layer. In 507, the locations of the switching cells in the sea of gates is established. The switching cells are located such that all of the sea of gates is covered by an effective area of a switching cell.

In 509, the standard cells of the logic circuitry are located in the row of cells. In 511, tie cells are located within non designated spaces in the row of cells. In one embodiment, the tie cells are to be placed within a certain distance of each other. In 513, filler cells are located in the non designated spaces of the rows of cells. In 513, the locations of the upper level lines including the vertical VDD lines, the vertical VSS lines, the vertical P well bias lines, and the vertical N well bias lines are set. In 517, the signal and clock lines locations are set including the ENABLE, EN_ALT and EN_BACK signals.

In other embodiments, an integrated circuit according to the present invention maybe designed by other processes.

With other embodiments, the well bias circuitry shown and described herein may be utilized to change the bias of the N well areas and P well areas for other operating modes of the integrated circuit. For example, the bias of the N well areas and P well areas of a sea of gates may be changed to adjust the threshold voltages of the transistors of a sea of gates during a normal operating mode. In other embodiments, the control inputs of each switching cell in an array are coupled together in parallel.

In one aspect of the invention, an integrated circuit includes a plurality of rows of cells. Each row of cells of the plurality includes a P well area and an N well area. The integrated circuit includes a plurality of P well bias contacts to bias the P well areas, a plurality of N well bias contacts to bias the N well areas, a first plurality of lines to carry a first voltage, a second plurality of lines to carry a second voltage, and a plurality of switching cells. Each switching cell is located in a row of cells of the plurality and is coupled to a line of the first plurality of lines, a line of the second plurality of lines, an N well bias contact of the plurality, and a P well bias contact of the plurality. Each of the plurality of switching cells includes a control input. In response to the control input being at a first state, the switching cell couples the line of the first plurality of lines to the N well bias contact of the plurality and couples the line of the second plurality of lines to the P well bias contact of the plurality.

In another aspect of the invention, an integrated circuit includes a row of cells including a doped well area, a well bias contact to bias the doped well area, a first line to carry a first voltage, and a switching cell located in the row of cells. The switching cell is coupled to the first line and the well bias contact. The switching cell includes a switch, a control input, and a level shifter. A first terminal of the switch is coupled to the first line, and a second terminal of the switch is coupled to the well bias contact. In response to the control input being at a first state, the level shifter provides a voltage equal to a voltage of the second terminal to a gate of the switch to make the switch non conductive.

In another aspect of the invention, an integrated circuit includes a plurality of rows of cells. Each row of the plurality of rows of cells includes a doped well area of a plurality of well doped areas. The integrated circuit includes a plurality of well bias contacts to bias the doped well areas of the plurality, a first plurality of lines to carry a first voltage, and a plurality of switching cells. Each switching cell of the plurality is located in a row of cells of the plurality of rows of cells. Each switching cell is coupled to a line of the first plurality of lines and a well bias contact of the plurality of well bias contacts. Each switching cell includes a control input. In response to the control input being at a first state, the switching cell couples the line of the first plurality of lines to the well bias contact of the plurality of well bias contacts. A first switching cell of the plurality of switching cells includes a control output coupled to a control input of a second switching cell of the plurality of switching cells. The control output of the first switching cell is responsive to the control input of the first switching cell.

In another aspect of the invention, an integrated circuit includes a row of cells including a P well area and an N well area, a P well bias contact to bias the P well area, an N well bias contact to bias the N well area, a first line to carry a first supply voltage, a second line to carry a second supply voltage, and a switching cell located in the row of cells. The switching cell includes a first switch coupled to the first line and the N well bias contact. The switching cell includes a second switch coupled to the second line and the P well bias contact. The switching cell includes a control input. In response to the control input being at a first state, the first switch is conductive to couple the first line to the N well bias contact to bias the N well area at the first supply voltage and the second switch is conductive to couple the second line to the P well bias contact to bias the P well area at the second supply voltage. In response to the control input being at a second state, the first and second switches are non conductive to enable the N well area to be biased at a voltage different from the first supply voltage and to enable the P well area to be biased at a voltage different from the second supply voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
   a plurality of rows of cells, each row of cells of the plurality of rows of cells including a P well area and an N well area;
   a plurality of P well bias contacts to bias the P well areas;
   a plurality of N well bias contacts to bias the N well areas;
   a first plurality of lines to carry a first voltage;
   a second plurality of lines to carry a second voltage;
   a plurality of switching cells, each switching cell is located in a row of cells of the plurality and is coupled to a line of the first plurality of lines, a line of the second plurality of lines, an N well bias contact of the plurality of N well bias contacts, and a P well bias contact of the plurality of P well bias contacts, each of the plurality of switching cells includes a control input, wherein in response to the control input being at a first state, the switching cell couples the line of the first plurality of lines to the N well bias contact of the plurality of N well bias contacts and couples the line of the second plurality of lines to the P well bias contact of the plurality of P well bias contacts.

2. The integrated circuit of claim 1 wherein the plurality of switching cells further comprises a first switching cell and a second switching cell, the first switching cell further includes a control output responsive to a control input of the first switching cell, a control input of the second switching cell is coupled to the control output of the first switching cell.

3. The integrated circuit of claim 2 wherein the plurality of switching cells further includes a third switching cell having a control input coupled to a control output of the second switch circuit.

4. The integrated circuit of claim 2 wherein the first switching cell includes a delay circuit between the control input of the first switching cell and the control output of the first switching cell, the delay circuit providing a delay in a change in state of the control output of the first switching cell with respect to a change in state of a control input of the first switching cell.

5. The integrated circuit of claim 1 wherein the plurality of switching cells each include a first switch and a second switch, wherein the first switch, when conductive, couples the line of the first plurality of lines to the N well bias contact, wherein the second switch, when conductive, couples the line of the second plurality of lines to the P well bias contact, wherein the conductivity of the first switch and the second switch is controlled by the control input.

6. The integrated circuit of claim 5 wherein each switching cell further comprises a first level shifter and a second level shifter, wherein in response to the control input being at a second state, the first level shifter provides a voltage to a gate of the first switch equal to an N well bias voltage to make the first switch non conductive, the N well bias voltage is different from the first voltage, and wherein in response to the control input being at the second state, the second level shifter provides a voltage to a gate of the second switch equal to a P well bias voltage to make the second switch non conductive, the P well bias voltage being different from the second voltage.

7. The integrated circuit of claim 1 wherein the plurality of switching cells are in a non uniform pattern in the plurality of rows of cells.

8. The integrated circuit of claim 1 wherein the plurality of rows of cells includes a plurality of areas wherein a switching cell of the plurality is located in each area of the plurality of areas.

9. The integrated circuit of claim 1 wherein when the control inputs are at a first state, the N well areas are biased at the first voltage and the P well areas are biased at the second voltage, wherein when the control inputs are at a second state, the N well areas are biased at third voltage different from the first voltage and the P well area are biased at fourth voltage different from the second voltage.

10. The integrated circuit of claim 9 wherein the third voltage is higher than the first voltage and the second voltage is higher than the fourth voltage.

11. The integrated circuit of claim 1 wherein the integrated circuit includes a processor, the processor including circuitry implemented in rows of cells of the plurality of rows of cells.

12. The integrated circuit of claim 1 wherein the plurality off rows of cells includes CMOS translators.

13. The integrated circuit of claim 1 further comprising:
a controller having an output coupled to a control input of a first switching cell of the plurality of switching cells, the controller having an input coupled to a control register, wherein the state of the output of the controller is responsive to the state of its input.

14. The integrated circuit of claim 1 further comprising:
a first voltage generating circuit having an output coupled to the plurality of N well bias contacts, wherein when activated, the first voltage generating circuit provides at its output a third voltage, wherein when the control input is at the first state, the output of the first voltage generating circuit is tri-stated;
a second voltage generating circuit having an output coupled to the plurality of P well bias contacts, wherein when activated, the second voltage generating circuit provides at its output a fourth voltage, wherein when the control input is at the first state, the output of the second voltage generating circuit is tri-stated.

15. The integrated circuit of claim 1 further comprising:
a third plurality of lines, each line of the third plurality is coupled to an N well bias contact of the plurality of N well bias contacts;
a fourth plurality of lines, each line of the fourth plurality is coupled to a P well bias contact of the plurality of P well bias contacts;
wherein each switching cell is coupled to a line of the third plurality of lines and a line of the fourth plurality of lines, wherein in response to the control input being at the first state, the switching cell couples the line of the first plurality of lines to the line of the third plurality of lines and couples the line of the second plurality of lines to the line of the fourth plurality of lines.

16. The Integrated circuit of claim 15 further comprising:
a plurality of tie cells, each tie cell of the plurality of tie cells is located in a row of cells of the plurality of rows of cells;
wherein each tie cell of the plurality of tie cells include, an N well bias contact to bias an N well area, the N well bias contact is coupled to one of the third plurality of lines, and each tie cell of the plurality of tie cells includes a P well bias contact to bias a P well area, the P well bias contact is coupled to one of the fourth plurality of lines.

* * * * *